United States Patent
Masters et al.

(10) Patent No.: US 6,337,465 B1
(45) Date of Patent: Jan. 8, 2002

(54) LASER MACHINING OF ELECTROACTIVE CERAMICS

(75) Inventors: Brett P. Masters, Brookline; John P. Rodgers, Arlington; Marthinus C. van Schoor, Medford, all of MA (US)

(73) Assignee: Mide Technology Corp., Medford, MA (US)

( * ) Notice: Subject to any disclaimer, the term of this patent is extended or adjusted under 35 U.S.C. 154(b) by 0 days.

(21) Appl. No.: 09/264,113

(22) Filed: Mar. 9, 1999

(51) Int. Cl.[7] .............................................. B23K 26/00
(52) U.S. Cl. .............................. 219/121.85; 219/121.69
(58) Field of Search .................. 219/121.85, 121.69, 219/121.68, 121.67; 427/100; 29/25.35; 310/330, 369; 367/140, 155, 156, 157, 160

(56) References Cited

U.S. PATENT DOCUMENTS

| | | | |
|---|---|---|---|
| 4,131,484 A | 12/1978 | Caruson et al. ................. 134/1 |
| 4,422,003 A | 12/1983 | Safari et al. ................. 310/358 |
| 4,422,055 A | 12/1983 | Cullen et al. ................. 333/151 |
| 4,642,505 A | 2/1987 | Arvanitis ..................... 310/312 |
| 4,650,619 A | 3/1987 | Watanabe ..................... 264/25 |
| 4,820,897 A | 4/1989 | Lefevre ................. 219/121.67 |
| 4,929,402 A | * 5/1990 | Hull |
| 5,126,615 A | * 6/1992 | Takeuchi et al. |
| 5,276,657 A | * 1/1994 | Newnham et al. |
| 5,281,888 A | * 1/1994 | Takeuchi et al. |
| 5,369,862 A | 12/1994 | Kotani et al. ............... 29/25.35 |
| 5,387,314 A | * 2/1995 | Baughman et al. |
| 5,398,885 A | 3/1995 | Andersson et al. ......... 244/1 R |
| 5,539,965 A | * 7/1996 | Safari et al. |
| 5,553,035 A | * 9/1996 | Seyed-Boloforsh |
| 5,594,292 A | * 1/1997 | Takeuchi et al. |
| 5,615,466 A | 4/1997 | Safari et al. ................. 29/25.35 |
| 5,622,748 A | * 4/1997 | Takeuchi et al. |
| 5,656,882 A | 8/1997 | Lazarus et al. ............. 310/328 |
| 5,687,462 A | 11/1997 | Lazarus et al. ............. 29/25.35 |
| 5,742,634 A | * 4/1998 | Rieger et al. |
| 5,744,898 A | * 4/1998 | Smith et al. |
| 5,796,207 A | 8/1998 | Safari et al. ................. 310/358 |
| 5,818,149 A | 10/1998 | Safari et al. ................. 310/358 |
| 5,866,469 A | * 2/1999 | Hays |
| 5,869,189 A | 2/1999 | Hagood et al. ............. 428/461 |
| 5,938,612 A | * 8/1999 | Kline-Schroder et al. |

OTHER PUBLICATIONS

Jones, *Mechanics of composite materials*, Scripta Book Co., pp. 90–97, 1975.

Kalpakjian, *Manufacturing processes for Engineering materials*, Addison–Wesley, pp. 840–844, 1997.

Smith, "The role of piezocomposites in ultrasonic transducers," IEEE 1989 Ultrasonics Symposium 2:755–766, Montreal, Quebec, Oct. 3–6 1989.

Waller, et al., "Piezoelectric lead zirconate titanate ceramic fiber/polymer composites," *Journal of the American Ceramic Society*, 1992.

* cited by examiner

*Primary Examiner*—Tom Dunn
*Assistant Examiner*—Jonathan Johnson
(74) *Attorney, Agent, or Firm*—Elizabeth E. Nugent; Choate, Hall & Stewart

(57) ABSTRACT

Laser beam machining is applied to form arbitrarily shaped electroactive ceramics for transducers (e.g., electromechanical sensors and actuators). One particularly preferred embodiment of the invention comprises machining parallel grooves in a ceramic plate to improve flexibility. The grooves provide strain relief in bending by relieving Poisson strains transverse to the direction of bending. This embodiment offers the further benefit that planar anisotropy or directionality is introduced in the transducer. The machining process of the invention further enables the production of more complex geometries than those currently known in the art. Because of the flexibility of the machining process, virtually any desired transducer shape may be produced.

16 Claims, 6 Drawing Sheets

LASER MACHINING OF ELECTROACTIVE CERAMICS

FIELD OF THE INVENTION

This application relates generally to methods of forming electroactive ceramics by laser machining, and more particularly to methods of producing sensors and actuators having superior mechanical and electroactive properties.

BACKGROUND OF THE INVENTION

Ceramic materials are brittle and are difficult and costly to form in arbitrary shapes. In particular, it would be desirable to form electroactive ceramics in more complicated shapes than those currently available.

Some methods of machining ceramics for a variety of reasons have been disclosed. For example, U.S. Pat. Nos. 4,131,484 to Caruso et al., 4,642,505 to Arvanitis, and 5,369,862 to Kotani et al. disclose using a laser to adjust the resonant frequency of a piezoelectric ceramic. U.S. Pat. Nos. 4,422,003, 5,615,466, 5,796,207, and 5,818,149, all to Safari et al., describe methods of producing polymer-ceramic piezoelectric composites. U.S. Pat. No. 4,650,619 to Watanabe describes a method of laser machining apertures in a ceramic member to create gas supply passages.

It is an object of the present invention to provide a method of machining electroactive ceramics which is relatively inexpensive, capable of producing complex shapes, and does not unduly compromise the electroactive properties of the electroactive ceramic. It is a further object of the present invention to provide sensors and actuators having flexibilities and anisotropic behaviors superior to those known in the art, as well as improved mechanical robustness and handling properties. It is still a further object of the present invention to provide sensors and actuators having shapes which allow superior electromechanical performance compared to those known in the art. It is yet a further object of the present invention to provide sensors and actuators which can be attached to electrodes in improved configurations.

SUMMARY OF THE INVENTION

The present invention achieves these and other objects by providing a method of machining electroactive ceramics for transducer applications. A Laser-Beam Machining (LBM) process is used to remove material selectively enable cuts, grooves and general forms for transduction. For example, a particularly useful form will be for surface strain relief of planar electroceramics. This introduces greater bending flexibility as well as directional or anisotropic coupling behavior in the material. Other example usages include relief patterns similar to those developed in silicon wafers for Micro ElectroMechanical Structures (MEMS). The LBM process includes through-cuts, grooves and other material removal from a ceramic substrate, and is not necessarily limited to planar structures. This process offers a cost-effective alternative for moderate to large-scale production of flexible, anisotropic sensors and actuators.

In one aspect, the invention includes a method of producing an electromechanical device, by poling an electroactive ceramic, laser machining the ceramic into a desired shape, and incorporating the ceramic into an electromechanical sensor or actuator. The laser machining may include, for example, machining grooves or slots in the ceramic, which may serve to render the properties of the ceramic anisotropic. The sensor or actuator may be a substantially planar, stress-relieved transducer. The electroactive ceramic may be, for example, a piezoelectric or electrostrictive ceramic. Poling may be achieved either before or after laser machining. Small or large amounts of material may be removed by machining, for example 1%, 5%, 20%, 50%, 75%, or 90% of the electroactive ceramic. The surface area of the ceramic may be increased by 10% or more by the machining process.

In another aspect, the invention comprises an electromechanical device comprising a substantially planar electroactive ceramic having grooves defined on a surface thereon, the grooves allowing the ceramic to conform to a curved surface, for example a surface having a radius of curvature of 0.25". The device may be, for example, an electromechanical sensor or actuator. Parallel grooves may allow the device to conform to a cylindrical surface, or concentric grooves may allow the device to conform to a spherical surface.

In yet another aspect, the invention comprises an electromechanical device comprising a substantially planar bimorph electroactive ceramic member. The member may have slots defined therein that allow multiplication of an electromechanical bending response of the bimorph member. The device may be, for example, an electromechanical sensor or actuator. The slots may be substantially concentric, substantially parallel, or in any other suitable geometry.

BRIEF DESCRIPTION OF THE DRAWING

The invention is described with reference to the several figures of the drawing, in which.

DETAILED DESCRIPTION

Figure 1A:
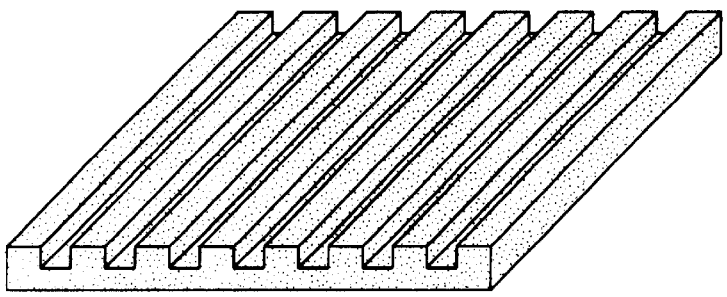
FIGS. 1a–1d illustrate some of the many transducer shapes which may be achieved by the methods of the invention.
Figure 1B:
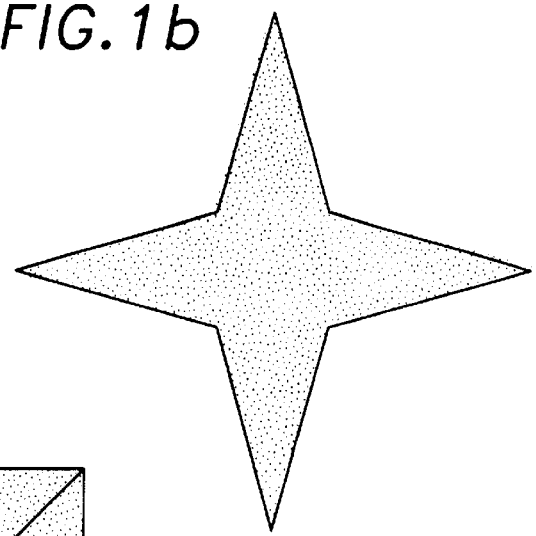
Figure 1C:
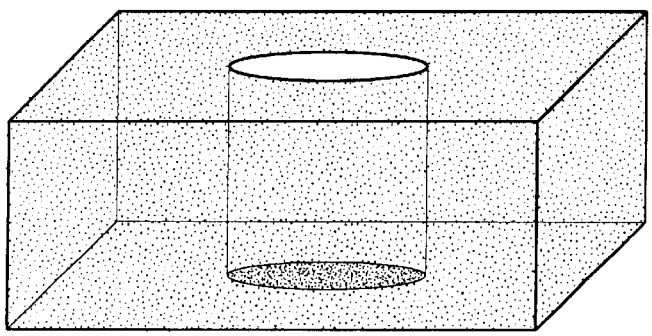
Figure 1D:
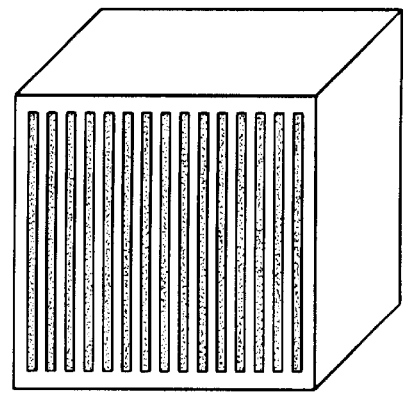

It is well known that ceramic materials are brittle and are difficult and costly to form in arbitrary shapes. Laser-beam machining (LBM) has been used for removing material from ceramics. In the present invention, this technique is applied to form arbitrarily shaped electroactive ceramics for transducers (e.g., electromechanical sensors and actuators). One particularly preferred embodiment of the invention comprises machining parallel grooves in a ceramic plate to improve flexibility. The grooves provide strain relief in bending by relieving Poisson strains transverse to the direction of bending. This embodiment offers the further benefit that planar anisotropy or directionality is introduced in the transducer. This embodiment may thus serve as a lower cost replacement for the polymer/ceramic composites disclosed, for example, in U.S. Pat. Nos. 4,422,003, 5,615,466, 5,796,207, and 5,818,149.

The LBM process further enables the production of more complex geometries than those currently known in the art.

Because of the flexibility of the machining process, virtually any desired transducer shape may be produced. Examples of shapes that may be produced by the process are shown in FIGS. 1a–1d.

This process may be applied to any type of electroactive ceramic material in any base form. The material can be processed with or without electrodes, and before or after any polarization process. The LBM process removes ceramic material in any arbitrary topography, including through-cuts, and three-dimensional relief patterns.

The process may be used in combination with other existing compositing techniques and packaging technology. Such techniques include the incorporation of polymer or other matrix materials, other passive or active phases, and/or flexible circuit layers. The flexible circuit layers may be used for electrical insulation, electrical connection points, and mechanical protection, as has been demonstrated with electroceramic wafers and composites containing fibrous or rod forms. Structural reinforcing materials may also be incorporated in the composites. Existing concepts of shaping for spatial filtering may also be applied, with the added benefit of thickness tailoring. This technology will also enable more complex geometries for electroceramic bimorph applications. As with MEMS technologies for etching silicon, the LBM process is used to design relief patterns in electroceramics.

The laser-machined electroceramics of the invention are expected to be particularly useful for electromechanical sensors and actuators. Actuators, for example, may be devices incorporating piezoelectric, electrostrictive, or magnetostrictive materials, which convert electrical or magnetic energy into mechanical energy. Electromechanical sensors generally use the same principles to convert mechanical energy into electrical or magnetic energy, thereby providing feedback about strains within a material.

The LBM Method: Laser-beam machining is a process in which highly focused, high-density energy melts and/or evaporates material from a substrate. The laser can be controlled to remove material in a desired location. Similar to a more traditional machining process or a carving process, the substrate or laser can be displaced in order to rapidly remove material in a prescribed manner. The depth of the material removed can also be controlled. Localized heating of the material must be considered while processing to limit the size of the heat-affected zone. While LBM has been used on a small scale for trimming resonators to adjust their frequency, it has generally been believed that this method would destroy the electroactive properties of the ceramic in the heat-affected zone. The present inventors have surprisingly discovered that this effect can be minimized or eliminated, and have demonstrated that an electroactive ceramic may not even require repoling after machining.

The LBM process has been implemented with a neodymium: yttrium-aluminum-garnet (Nd:YAG) laser. The laser has a variable aperture, variable power, and variable pulsing which can be used to control the removal of material, In addition, scanning mirrors are used to precisely deflect the laser beam and control its position on the ceramic surface within a fraction of a mil. This laser has a standard beam width of 0.004", which can be adjusted to as low as 0.001" with some reduction in power. Forms with features on the order of 0.002" in size, and curves with a radius of approximately 0.002" should be achievable with this laser. By varying the rate of translation and the laser power and pulsing variables, the effective cut width and depth can be controlled. Cut depths ranging from 1% to 100% of the wafer thickness have been achieved, for wafers having thicknesses in the range of 0.005" to 0.020". Using a different laser system should enable further expansion of the possible designs which can be produced. A system with a smaller beam width and precise scanning controls can enable the machining of smaller features in the ceramic.

Figure 2A:
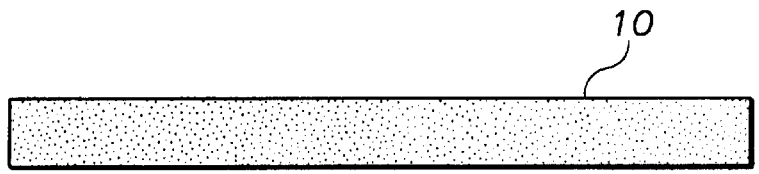
FIGS. 2a–2d illustrate the process of machining a wafer and incorporating it into a composite transducer.
Figure 2B:
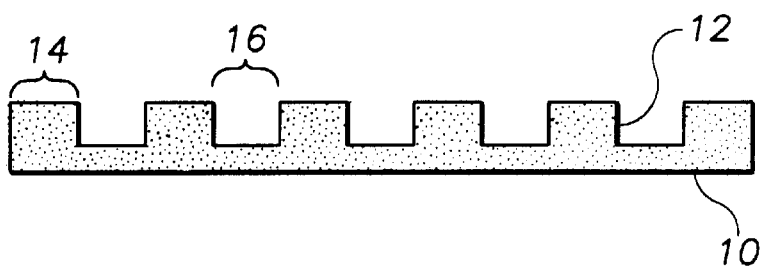
Figure 2C:
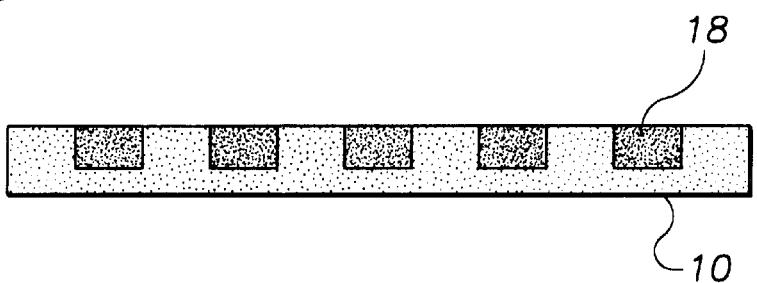

Example Analysis for Planar Forms: For a planar electroceramic form, typically referred to as a wafer, the benefit of the LBM process can be clearly illustrated. It should be noted that this is only one specific example of the potential applications of the method described herein which is applicable to more general forms. The process is illustrated mechanically in FIGS. 2a–2d. The wafer 10 has a thin plate geometry, which is essentially isotropic. Given a rectangular plate, the process may be applied to remove material along multiple parallel lines, oriented along the longitudinal axis. This will form multiple grooves 12 in the ceramic material 10, which are not complete through-cuts. Thus the ceramic remains in one continuous piece. FIG. 2a depicts a cross-section prior to machining, and FIG. 2b depicts the cross-section after the grooves have been cut.

Next consider the effective stiffness of the resulting ceramic form or electroceramic device 10. The ceramic material is essentially divided into parallel strips 14 having the original thickness of the plate and joined by strips of reduced thickness 16. Now consider the limiting case in which the thickness of the thinner strips 16 is set arbitrarily close to zero. Macroscopically, the ceramic material now can be considered as multiple parallel strips of ceramic spaced apart with air gaps in between. Clearly, the longitudinal stiffness of the ceramic device, measured along the length of the strips, and the transverse stiffness, measured across the strips and air gaps, will not be equal as was initially the case with the wafer. The device may be considered as a composite consisting of ceramic strips and strips of air in between. Using a Mechanics of Materials approach, the effective stiffness of the device along the longitudinal axis will be reduced by the ratio of the cross-sectional area of ceramic to the total initial area since the stiffness of the air gap is negligible. Along the transverse axis, the effective stiffness will be zero since any applied strain on the material will result in zero force. The dimensions and spacing of the grooves cut into the ceramic can be set to achieve a desired reduction in the transverse stiffness. The longitudinal stiffness will be much less sensitive to this selection.

While the microscopic electromechanical coupling behavior will remain substantially unchanged in the machined ceramic form, the macroscopic behavior will differ significantly as a result of the stiffness anisotropy. In a typical application for actuation or sensing, a planar electroceramic may be bonded to or embedded within a planar host structure. Mechanical deformation and stresses in the structure are coupled to those in the electroceramic through the bond layer, similar to a multi-layer composite laminate. As a result of the anisotropic stiffness described in the limit case above, a structural deformation in the host structure along the transverse axis of the device will result in no electromechanical coupling, as a result of the negligible transverse stiffness. A macroscopic deformation of the device form will result in no actual strain in the electroceramic material, and thus no coupling from mechanical energy to electrical energy. However, coupling will remain along the longitudinal axis of the device. This form of anisotropy in an transducer can be used advantageously in the design of active structures.

Figure 2D:
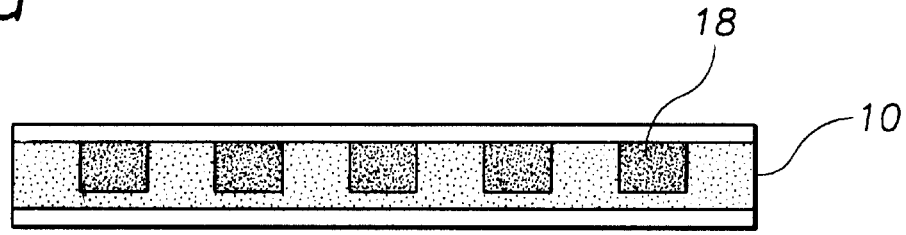

This example can also be used to illustrate additional benefits of such a geometry. The same device can be combined with a second phase 18, such as a compliant matrix material, to form a composite, shown in FIG. 2c. Alternatively, the grooves may be filled with an electrode material to provide a strong mechanical and electrical connection between the electroactive ceramic and the electrode. Optionally, the composite may be further packaged, as shown in FIG. 2d. As has been demonstrated in prior art, a composite form consisting of relatively stiff fibers in a compliant matrix offers the advantage of increased specific strength and toughness as compared with a monolithic form of the fiber material. In this example, the machining parameters may be set to achieve a geometry similar to that of a fibrous composite. The process can also be considered as a strain- or stress-relief process for the ceramic material where transverse stresses are relieved during longitudinal bending. Thus the LBM process can be used to effectively produce a composite transducer device.

A further benefit of the device shown in FIG. 2b as compared to fibrous composites is that its handling characteristics are significantly improved. Fibers of electroactive ceramics are brittle and difficult to align and form into a composite. Crossed fibers break easily when a fiber preform is compressed or otherwise stressed. In addition, currently available fibers are more porous than bulk material, and are difficult to make in a uniform size, leading to significant problems when attaching electrodes. In addition, many fibers exhibit significant curvature. These characteristics make it difficult to achieve a quality fibrous composite actuator or sensor. In contrast, the sensors and actuators of the invention are mechanically robust, and it is relatively easy to predict and control their electromechanical properties.

EXAMPLES

Figure 3A:
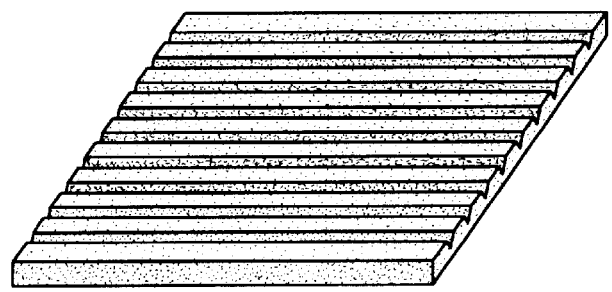
FIGS. 3a–3c illustrate how a transducer according to the invention may be used on a cylindrical surface.
Figure 3B:
Figure 3C:
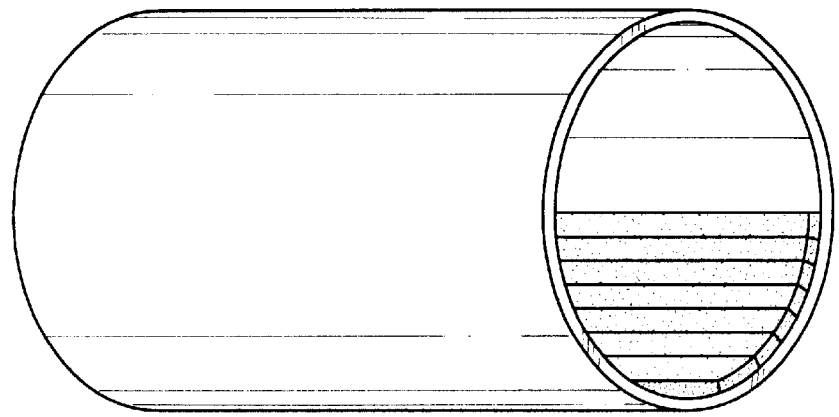

The LBM technique has been successfully applied to a planar electroceramic wafer. The material was a Lead Zirconate Titanate (PZT-5A) which was initially electroded and poled through the thickness, as received from the manufacturer. A number of parallel grooves were machined into one surface of a 3 inch square wafer which was 0.005 inches thick. The grooves were approximately 0.005 inches wide and were spaced evenly approximately 0.020 inches apart. Beam width was 0.004 inches; slightly more material was removed because of heat transfer in the ceramic. Actuation testing of the test article after machining showed no degradation in induced free strain capability or polarization. In addition, an in-plane anisotropy was measured such that lower strain levels were recorded transverse to the axis of the grooves and greater flexibility was also observed, allowing the wafer to be used, for example, on the surface of a cylinder, as shown in FIGS. 3a–3c. The results indicate that the ceramic material surrounding the machined areas (the heat-affected zone) was not significantly degraded and that the strain relief concept was viable. It will be apparent to those skilled in the art that grooves may be positioned to allow the wafer to conform to other shapes. For example, concentric circular grooves may be used to allow the wafer to conform to a spherical surface.

Figure 4:
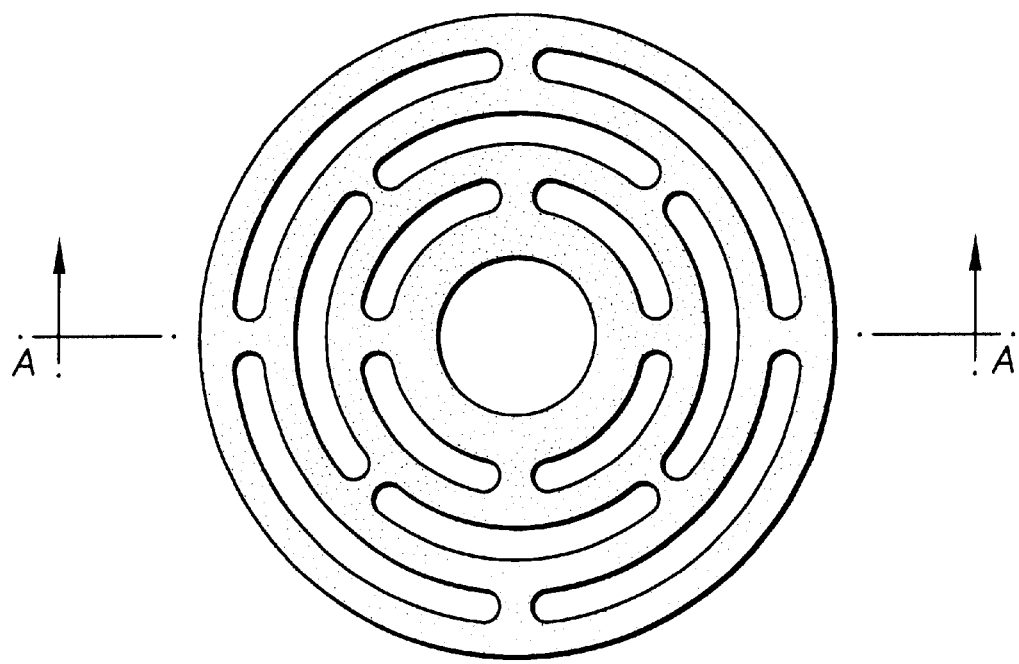
FIG. 4 illustrates a displacement amplifying device according to the invention.
Figure 5:
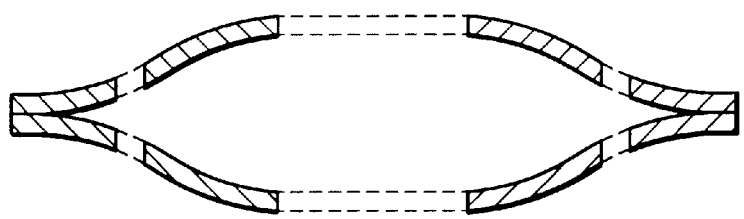
FIG. 5 shows a cross-section of two displacement amplifying devices as shown in FIG. 4.
Figure 6A:
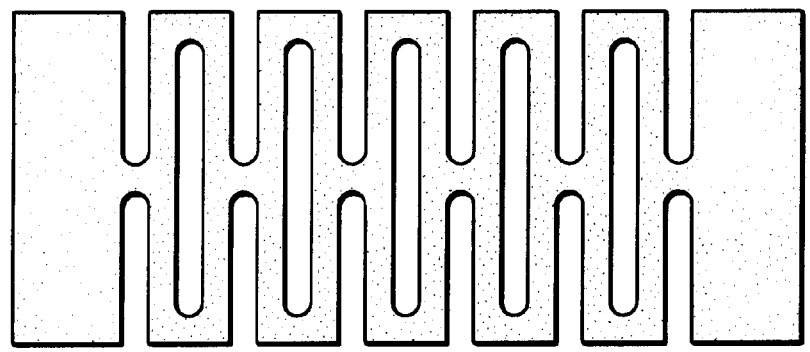
FIGS. 6a–6b illustrate other displacement amplifying devices according to the invention.
Figure 6B:
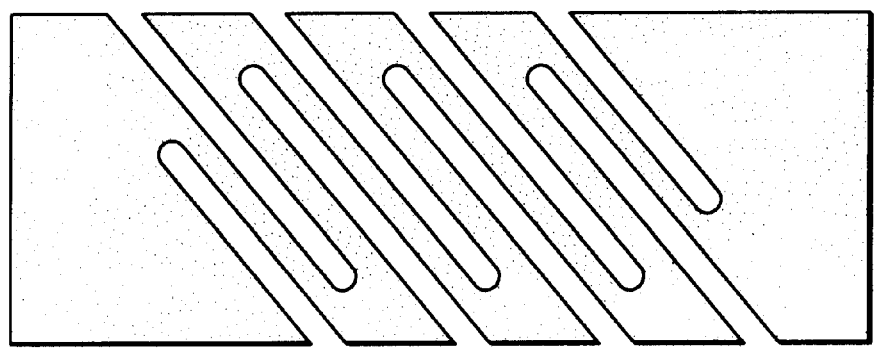
Figure 7:
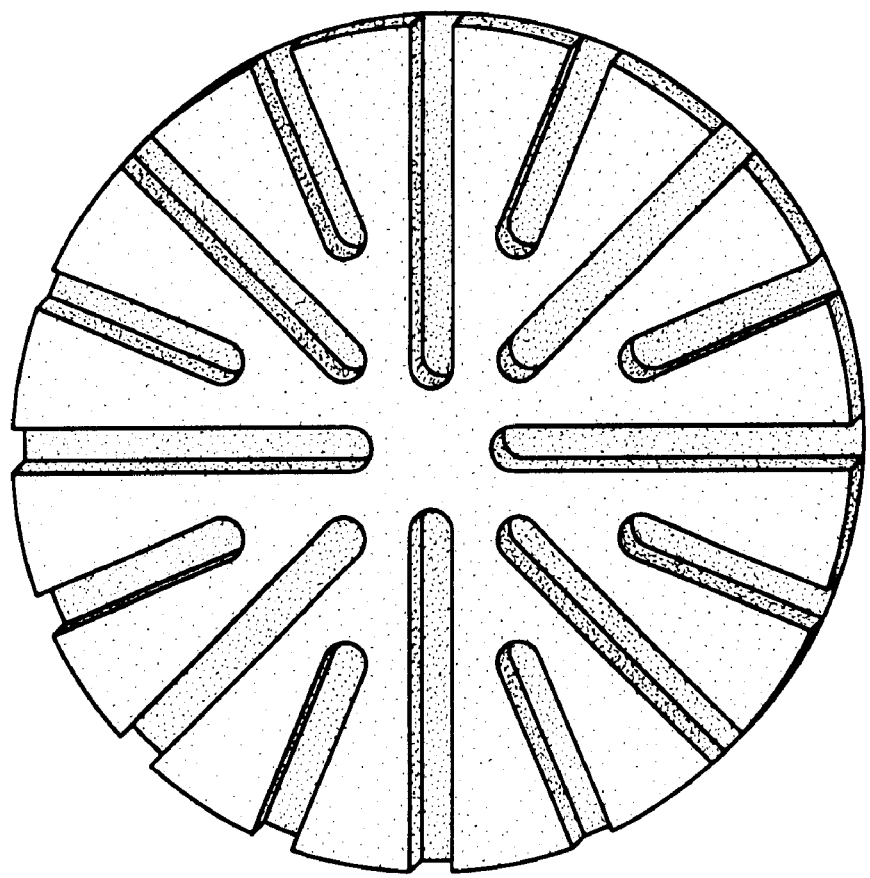
FIG. 7 illustrates a radially patterned actuator according to the invention.

A second unique design which can be achieved by the LBM process is illustrated in FIG. 4. That figure shows a round bimorph displacement amplifying device. In a bimorph device, electroceramic material is used in a two-layer configuration. The upper and lower layers are actuated opposingly so that an extension in one layer is commanded simultaneously with a contraction in the other. The net effect is a bending actuation. The LBM process can be used to cut circular ring shaped holes in a ceramic bimorph disk in the pattern shown in FIG. 4, enabling large out-of-plane deflections. FIG. 5 shows a cross-sectional view along section A—A of a mirrored pair of actuated disks, which act together to further increase the displacement capability. Those skilled in the art will perceive that the pattern of shaped holes may be changed to alter the response of the actuator. For example, a pattern of parallel, rather than concentric, slots may be preferred in certain applications, in particular for producing a "bending" actuator, as illustrated in FIG. 6a. A relating "twisting" configuration which is expected to achieve improved flexibility is shown in FIG. 6b. Still another actuator is shown in FIG. 7; this radially patterned transducer may be used for acoustic actuation, for example.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method of producing an electromechanical device, comprising:
   poling the electroactive ceramic;
   laser machining the electroactive ceramic to form a desired shape, including machining grooves into a surface of the electroactive ceramic; and
   incorporating the electroactive ceramic into an electromechanical sensor or actuator.

2. The method of claim 1, further comprising depositing an electrode material into the grooves in the surface of the electroactive ceramic.

3. The method of claim 1, further comprising depositing an electrode material onto a surface of the electroactive ceramic produced by laser machining.

4. The method of claim 1, wherein the produced sensor or actuator is a strain-relieved, planar transducer.

5. The method of claim 1, wherein the electroactive ceramic is selected from the group consisting of piezoelectric ceramics and electrostrictive ceramics.

6. The method of claim 1, wherein poling the electroactive ceramic precedes laser machining.

7. The method of claim 1, wherein poling the electroactive ceramic follows laser machining.

8. The method of claim 1, wherein the electroactive ceramic comprises grooves which render its electromechanical properties anisotropic.

9. The method of claim 1, wherein at least 1% of the electroactive ceramic is removed during laser machining.

10. The method of claim 9, wherein at least 5% of the electroactive ceramic is removed during laser machining.

11. The method of claim 9, wherein at least 20% of the electroactive ceramic is removed during laser machining.

12. The method of claim 9, wherein at least 50% of the electroactive ceramic is removed during laser machining.

13. The method of claim 9, wherein at least 75% of the electroactive ceramic is removed during laser machining.

14. The method of claim 9, wherein at least 90% of the electroactive ceramic is removed during laser machining.

15. The method of claim 1, wherein the electroactive ceramic possesses a surface area at least 10% greater after machining than its surface area before machining.

16. The method of claim 1, further comprising:
   after machining and prior to incorporating the electroactive ceramic into a sensor or actuator, deforming the electroactive ceramic into a substantially three-dimensional shape.

* * * * *